US00RE36077E

United States Patent [19]

Michii et al.

[11] E Patent Number: Re. 36,077

[45] Reissued Date of Patent: Feb. 2, 1999

[54] METHOD OF MANUFACTURING INVERSION TYPE IC'S AND IC MODULE USING SAME

[75] Inventors: Kazunari Michii; Hiroshi Seki, both of Itami, Japan

[73] Assignee: Mitsubishi Denki Kabushiki Kaisha, Tokyo, Japan

[21] Appl. No.: 494,065

[22] Filed: Jun. 23, 1995

Related U.S. Patent Documents

Reissue of:

[64] Patent No.: 5,303,120
Issued: Apr. 12, 1994
Appl. No.: 956,104
Filed: Oct. 2, 1992

[30] Foreign Application Priority Data

Oct. 15, 1991 [JP] Japan ..... 3-266412

[51] Int. Cl.[6] ..... H05K 5/02; H01R 43/16; H01L 23/495; H01L 21/60

[52] U.S. Cl. ..... 351/813; 29/827; 174/52.4; 257/666; 257/676; 257/692; 257/735; 361/760; 438/123; 438/611; 438/617

[58] Field of Search ..... 361/760, 767, 361/707, 749, 744, 772, 778, 792, 807; 29/830–832, 834; 174/52.2, 260, 262, 255, 266, 52.4; 257/666, 678, 690, 778, 780, 781, 788, 787, 692–696, 723, 724, 676, 668, 786, 735; 437/209, 211, 215, 219, 220, 205, 208; 228/180.1, 180.21, 180.22; 435/65, 68, 525

[56] References Cited

U.S. PATENT DOCUMENTS

| | | | |
|---|---|---|---|
| 4,710,680 | 12/1987 | Nakatani et al. | 361/760 |
| 4,796,078 | 1/1989 | Phelps, Jr. et al. | 257/696 |
| 4,891,789 | 1/1990 | Quattrini et al. | 361/777 |

(List continued on next page.)

FOREIGN PATENT DOCUMENTS

| | | | |
|---|---|---|---|
| 0430204 | 6/1991 | European Pat. Off. . | |
| 3913221 | 11/1989 | Germany . | |
| 59-144155 | 8/1984 | Japan | 257/724 |
| 60-200559 | 10/1985 | Japan . | |
| 62-168652 | 7/1987 | Japan . | |
| 63-175454 | 7/1988 | Japan | 257/696 |

(List continued on next page.)

OTHER PUBLICATIONS

IBM Technical Disclosure Bulletin, "System Electronic Packaging Architecture" vol. 38 No. 12 pp. 13–16, Dec. 1995.

IBM Technical Disclosure Bulletin "High Density and Speed Performance Chip Joining Procedure and Package" by P.F. Iafrate vol. 15 No. 4, Sep. 1972.

Proceedings of the Electronic Components Conference, Los Angeles CA, IEEE, N.Y., US, pp. 552–557; W.C. Ward:

(List continued on next page.)

*Primary Examiner*—Donald Sparks
*Attorney, Agent, or Firm*—Leydig, Voit & Mayer

[57] ABSTRACT

A method of manufacturing inversion ICs includes the steps of connecting a first electrode pad group of a semiconductor chip to a second lead group via wires, connecting a second electrode pad group of the semiconductor chip to a first lead group via wires, sealing the semiconductor chip, the first and second lead groups, and the wires in a resin so that the outer lead portions of the leads are exposed, and bending the outer lead portions of the leads toward the bottom surface of the semiconductor chip. An IC module includes a mounting substrate, a standard IC mounted on the top surface of the mounting substrate, an inversion IC mounted on the bottom surface of the mounting substrate so that the leads providing connections to the same functions in the standard and inversion ICs are at the same point on opposite sides of the mounting substrate, and a plurality of connecting members on the mounting substrate, electrically connecting the opposed leads of the standard IC and the leads of the inversion IC together.

23 Claims, 11 Drawing Sheets

U.S. PATENT DOCUMENTS

| | | | |
|---|---|---|---|
| 4,937,656 | 6/1990 | Kohara | 257/676 |
| 4,994,896 | 2/1991 | Uemura et al. | 257/724 |
| 5,061,990 | 10/1991 | Arakawa et al. | 257/724 |
| 5,068,712 | 11/1991 | Murakami et al. | 257/696 |
| 5,229,329 | 7/1993 | Chai et al. | 437/219 |
| 5,297,107 | 3/1994 | Metzerger et al. | 361/778 |
| 5,309,020 | 5/1994 | Murasawa et al. | 257/724 |
| 5,327,009 | 7/1994 | Igeta | 257/666 |
| 5,432,127 | 7/1995 | Lamson et al. | 437/215 |
| 5,508,565 | 4/1996 | Hatakeyama et al. | 257/723 |

FOREIGN PATENT DOCUMENTS

| | | | |
|---|---|---|---|
| 1-76748 | 3/1989 | Japan | 257/724 |
| 1-304795 | 12/1989 | Japan | 228/180.1 |
| 1-305562 | 12/1989 | Japan | 257/724 |
| 2-114544 | 4/1990 | Japan | 361/820 |
| 2-250389 | 10/1990 | Japan | 439/65 |
| 3-73578 | 3/1991 | Japan | 257/724 |
| 3-250637 | 11/1991 | Japan | 257/696 |
| 4-56347 | 2/1992 | Japan | 257/678 |
| 4-188860 | 7/1992 | Japan | 257/696 |
| 4-256351 | 9/1992 | Japan | 257/686 |
| 4-267546 | 9/1992 | Japan | 257/723 |
| 4-291787 | 10/1992 | Japan | 361/783 |
| 4-335561 | 11/1992 | Japan | 361/777 |
| 5-109979 | 4/1993 | Japan | 257/723 |
| 2115220 | 9/1983 | United Kingdom . | |

OTHER PUBLICATIONS

"Volume Production of Unique Plastic Surface–Mount Modules . . . Techniques", May 1988.

METHOD OF MANUFACTURING INVERSION TYPE IC'S AND IC MODULE USING SAME

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a method of manufacturing inversion type ICs for high-density mounting and to an IC module in which inversion ICs are mounted.

2. Description of the Related Art

The construction of a conventional resin seal type IC 8 is shown in FIG. 18. A semiconductor chip 1 is mounted on a die pad. An electrode pad 2 on a surface 1a of the semiconductor chip 1 is electrically connected to an inner lead portion of a corresponding lead 4 by a wire 3. The semiconductor chip 1, the wire 3, the inner lead portion of the lead 4 and the die pad 11 are sealed by a main body of a package 5 made of a resin so that an outer lead portion 6 of the lead 4 is exposed. The outer lead portion 6 of each lead 4 is usually bent toward the bottom surface 1b of the semiconductor chip 1 in order to mount the IC.

When a plurality of ICs constructed as described above are mounted on a single mounting substrate and, for example, when a large-capacity storage device is formed, leads of the same pin numbers of a plurality of leads having the same functions must be connected to each other. When, for example, a plurality of ICs are mounted on both sides of a mounting substrate, since the pin arrangement of ICs mounted on the top surface of the mounting substrate does not match the IC pin arrangement mounted on the bottom surface, leads having the same functions do not match each other. Also, when a plurality of ICs are mounted on a single surface of a mounting substrate, leads having the same functions do not meet each other in adjacent ICs. As a consequence, there is a problem in that, since leads having the same functions are connected to each other, wiring on a mounting substrate becomes complex.

A method shown in FIG. 19 for solving such a problem is disclosed in Japanese Utility Model Laid-Open No. 62-168652. In this method, ICs, such as ICs 9, have inverted pin connections formed by bending the outer lead portion 6 toward the top surface 1a of the semiconductor chip 1, in contrast with standard ICs, such as ICs 8, in which the outer lead portion 6 is bent toward the bottom surface 1b of the semiconductor chip 1. A standard IC 8 is mounted on a top surface 7a of a mounting substrate 7, and an inversion IC 9 is mounted on a bottom surface 7b thereof. With this construction, leads corresponding to each other can be connected easily by merely providing a through hole 10 on the mounting substrate 7 because the leads of the same pin numbers of both ICs 8 and 9 are at the same point with the mounting substrate 7 in between.

However, if an ultra-thin package, such as a TSOP (Thin Small Outline Package) having a thickness of approximately 1 mm, is mounted as shown in FIG. 19, the following problem occurs. Since the package is thin, the outer lead portion 6 exposed to the outside from the main body 5 of the package is short. If heat stress, such as heat cycling, is applied thereto, the solder connection portion between the outer lead portion 6 and the mounting substrate 7 is destroyed by a short cycle. For this reason, although it may seem that, to absorb heat stress, for example, a lead guide surface of the IC 8 should be made higher and the length Li from the lead guide surface to the mounting substrate 7 made longer, in the inversion type ICs 9, on the contrary, the length L2 from the lead guide surface to the mounting substrate 7 becomes shorter, and the performance deteriorates.

In addition, there is another problem in that, productivity is reduced since the shapes of the bent leads are different for ICs 8 and 9 and two types of dies for bending operations are required to manufacture standard and inversion type ICs.

SUMMARY OF THE INVENTION

The present invention has been achieved to solve the above-mentioned problems of the prior art.

An object of the present invention is to provide a method of manufacturing highly reliable inversion ICs which can be mounted in high densities with simple wiring.

Another object of the present invention is to provide highly reliable IC modules which use such inversion ICs.

To these ends, according to the present invention, there is provided a method of manufacturing inversion type ICs by using semiconductor chips which are the same as for standard ICs in which first and second electrode pad groups are connected via wires to first and second lead groups, respectively, all of which are formed on a surface of a semiconductor chip, and the outer lead portions of the leads are bent toward the bottom surface of the semiconductor chip, the pin connections thereof being inverted, the method including the steps of: connecting a first electrode pad group of a semiconductor chip to a second lead group via wires; connecting a second electrode pad group of the semiconductor chip to a first lead group via wires; sealing the semiconductor chip, the first and second lead groups and the wires in a resin so that the outer lead portions of the leads are exposed; and bending the outer lead portions of the leads toward the bottom surface of the semiconductor chip.

According to one aspect, the present invention which achieves these objectives relates to an IC module including a mounting substrate; a standard type IC, mounted on a surface of the mounting substrate, in which first and second electrode pad groups on the surface of the semiconductor chip are connected via wires to first and second lead groups, respectively, and the outer lead portions of the leads are bent toward the bottom surface of the semiconductor chip; an inversion type IC which is mounted on the bottom surface of the mounting substrate so that the of the inversion IC having the same function as those of the standard type IC come to the same point with the mounting substrate in between, first and second electrode pad groups formed on the surface of the semiconductor chip being connected via wires to second and first lead groups, respectively, and the outer lead portions of the leads being bent toward the bottom surface of the semiconductor chip; and a plurality of connecting members, provided on the mounting substrate, for electrically connecting the leads of the standard type IC and the leads of the inversion type IC having the same function as those of the standard type IC.

According to another aspect, the present invention which achieves these objectives relates to an IC module including: a mounting substrate; a standard type IC, mounted on a surface of the mounting substrate, in which first and second electrode pad groups on the surface of the semiconductor chip are connected via wires to first and second lead groups, respectively, and the outer lead portions of the leads are bent toward the bottom surface of the semiconductor chip; and an inversion type IC which is mounted on the surface of the mounting substrate so that the leads thereof and the leads of the standard type IC having the same function as those of the inversion type IC are adjacent to each other and electrically connected to each other, first and second electrode pad groups on the surface of the semiconductor chip being connected via wires to second and first lead groups, respectively, and the outer lead portions of the leads being bent toward the bottom surface of the semiconductor chip.

According to the method of manufacturing inversion ICs of the present invention, first and second electrode pad groups on a surface of a semiconductor chip are connected via wires to second and first lead groups, respectively, in a manner opposite to that in the standard type IC, and the outer lead portions of each of the leads are bent toward the bottom surface of the semiconductor chip in the same manner as in the standard type IC.

In the IC module, a standard type IC is mounted on a surface of a mounting substrate, whereas an inversion type IC manufactured by the method described in claim 1 is mounted on the bottom surface of the mounting substrate. The leads of the standard type IC and the inversion type IC, having the same functions, are arranged so that they come to the same point with the mounting substrate inbetween, and are electrically connected to each other by connection members.

In an IC module according to another aspect of the present invention, the standard type IC and the inversion type IC manufactured by the described method are both mounted on the surface of the mounting substrate, and the leads of the standard type IC and the inversion type IC, having the same functions, are arranged adjacent to each other and are electrically connected to each other.

DESCRIPTION OF THE PREFERRED EMBODIMENTS

Preferred embodiments of the present invention will be explained below with reference to the accompanying drawings.

Figure 1:
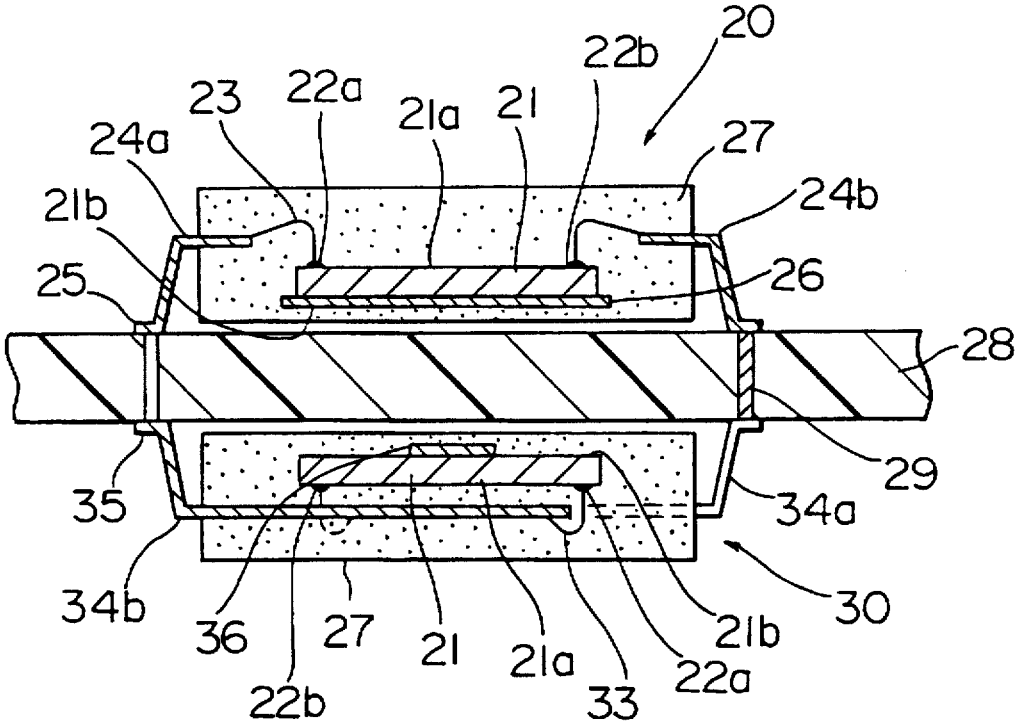
FIG. 1 is a cross-sectional view illustrating an IC module according to a first embodiment of the present invention.
Figure 2:
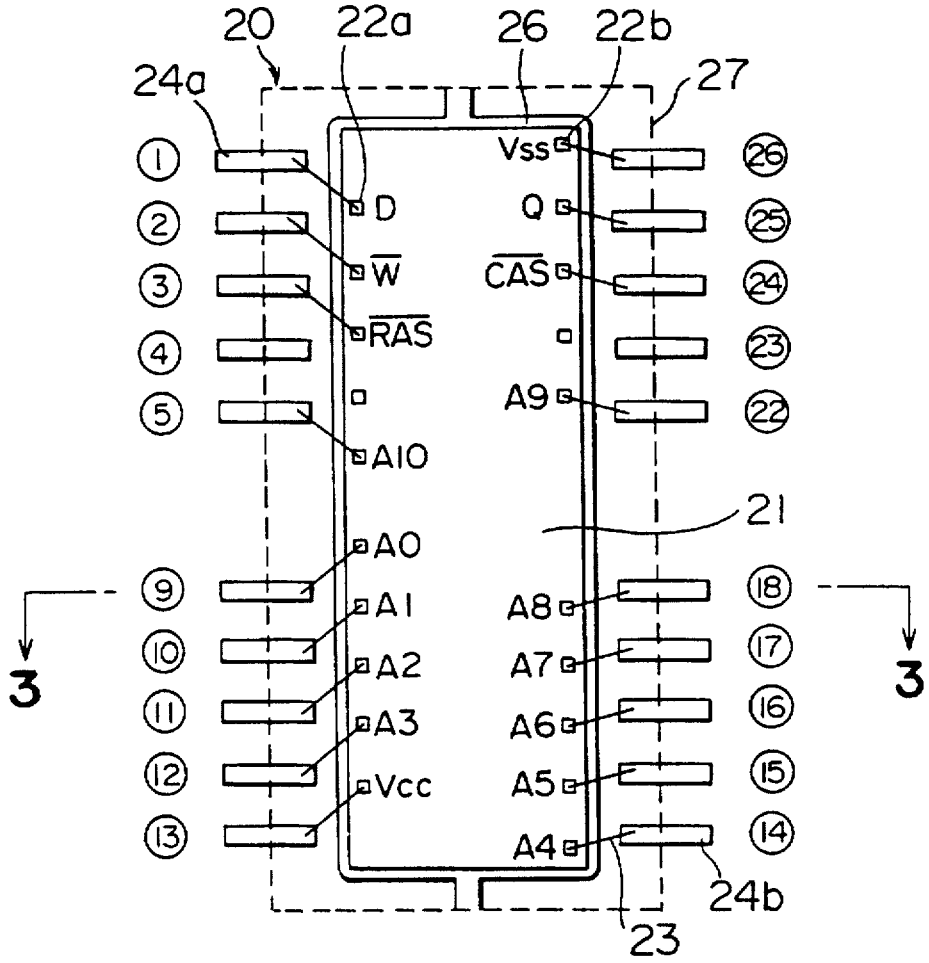
FIG. 2 is a plan view illustrating a standard type IC used in the first embodiment of the present invention.
Figure 3:
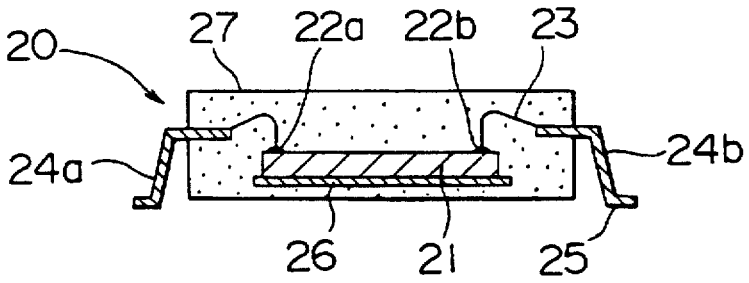
FIG. 3 is a cross-sectional view taken along the line [A—A] *3—3* of FIG. 2.

In FIG. 1, a standard type IC 20 is mounted on the top surface of a mounting substrate 28, and an inversion type IC 30 is mounted on the bottom surface thereof. The standard type IC 20 has a die pad 26, as shown in FIGS. 2 and 3. A semiconductor chip 21 is mounted on the die pad 26. First and second electrode pad groups 22a and 22b are located on a surface 21a of the semiconductor chip 21 along both sides of the length of the semiconductor chip 21. A first lead group 24a formed of leads 1 through 13 and a second lead group 24b formed of leads 14 through 26 are arrayed in the vicinity of the long sides of the semiconductor chip 21. Each of the electrode pads of the first electrode pad group 22a of the semiconductor chip 21 is electrically connected via one of wires 23, to an inner lead portion of a corresponding lead of the first lead group 24a. Likewise, each of the electrode pads of the second electrode pad group 22b is electrically connected via one of the wires 23 to an inner lead portion of a corresponding lead of the second lead group 24b. The semiconductor chip 21, the wires 23, the inner lead portion of each of the leads, and the die pad 26 are sealed in a main body of a package 27 made of a resin so that the outer lead portions 25 of the leads of the first and second lead groups 24a and 24b are exposed. The outer lead portion 25 of each of the leads is bent toward the bottom surface 21b of the semiconductor chip 21.

Figure 4:
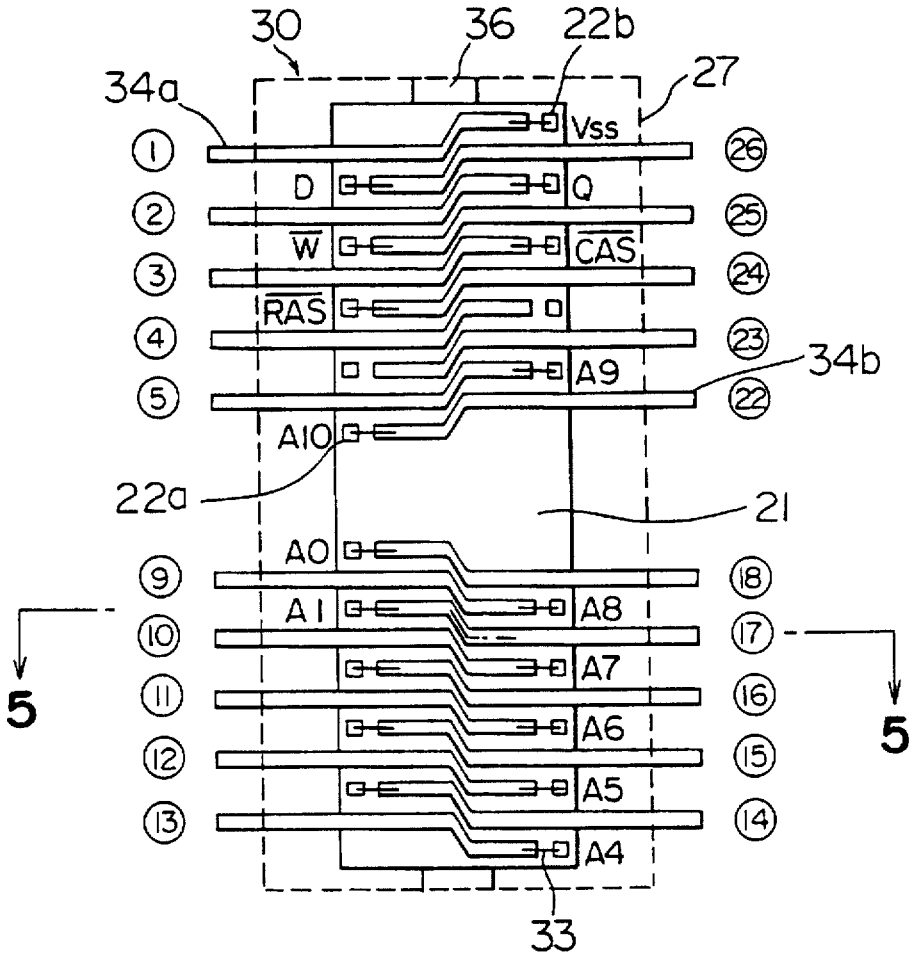
FIG. 4 is a plan view illustrating an inversion type IC used in the first embodiment.
Figure 5:
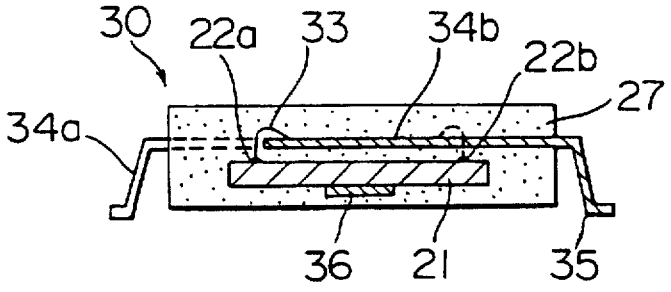
FIG. 5 is a cross-sectional view taken along the line [B—B] *5—5* of FIG. 4.

On the other hand, the inversion type IC 30 has a die pad 36, as shown in FIGS. 4 and 5. The semiconductor chip 21 similar to that used in the standard type IC 20 is mounted on the die pad 36. A first lead group 34a formed of leads 1 through 13 and a second lead group 34b formed of leads 14 through 26 are alternatingly arrayed above the semiconductor chip 21. Contrary to the standard type IC 20, each of the electrode pads of the first electrode pad group 22a of the semiconductor chip 21 is electrically connected via one of wires 33 to an inner lead portion of a corresponding lead of the second lead group 34b, while each of the electrode pads of the second electrode pad group 22b of the semiconductor chip 21 is electrically connected via one of wires 33 to an inner lead portion of a corresponding lead of the first lead group 34a. The semiconductor chip 21, the wires 33, the inner lead portion of each of the leads, and the die pad 36 are sealed by the package's main body 27 made of a resin so that the outer lead portions 35 of the leads of the first and second lead groups 34a and 34b are exposed. The outer lead portions 35 of the leads are bent toward the bottom surface 21b of the semiconductor chip 21 in the same manner as in the standard type IC 20.

4M dynamic RAMs are shown as examples for the ICs 20 and 30. In FIGS. 2 and 4, circled numerals near respective leads indicate the lead numbers of the respective leads. Letters written near respective electrode pads of the semiconductor chip 21 indicate the functions of the respective electrode pads. For example, D indicates data input; Q indicates data output; $\overline{W}$ indicates write control input; $A_0$ to $A_{10}$ indicate address input; $V_{cc}$ indicates a power supply input of 5V; and $V_{ss}$ indicates a reference voltage input of 0V.

As described above, a group of leads to which the first and second electrode pad groups 22a and 22b are connected are inverted for the standard type IC 20 and the inversion type IC 30. That is, in the standard type IC 20, the first and second electrode pad groups 22a and 22b are connected to the first lead group 24a and the second lead group 24b, respectively. In the inversion type IC 30, the first and second electrode pad groups 22a and 22b are connected to the second lead group 34b and the first lead group 34a, respectively. For this reason, for example, the electrode pad for data input is connected to the first lead of the 35 of the leads are bent toward the bottom surface 21b of the semiconductor chip 21 in the same manner as in the standard type IC 20.

As shown in FIG. 1, since the leads of the ICs 20 and 30 are guided to the outside from a position deviated from the central portion of the package's main body 27 toward a position higher than and facing the surface 21a of the semiconductor chip 21, and bent toward the bottom surface 21b of the semiconductor chip 21, the length of the leads exposed outside of the package's main body 27 can be make relatively long. As a result, reliability against heat stress after mounting is improved.

In addition, since the outer leads 35 of the leads of the inversion type IC 30 are bent toward the bottom surface 21b of the semiconductor chip 21 in the same manner as the outer leads 25 of the standard type IC 20, a die for the bending operation can be used which is common to the standard type IC 20 and the inversion type IC 30. Thus, workability and productivity are improved.

Figure 6:
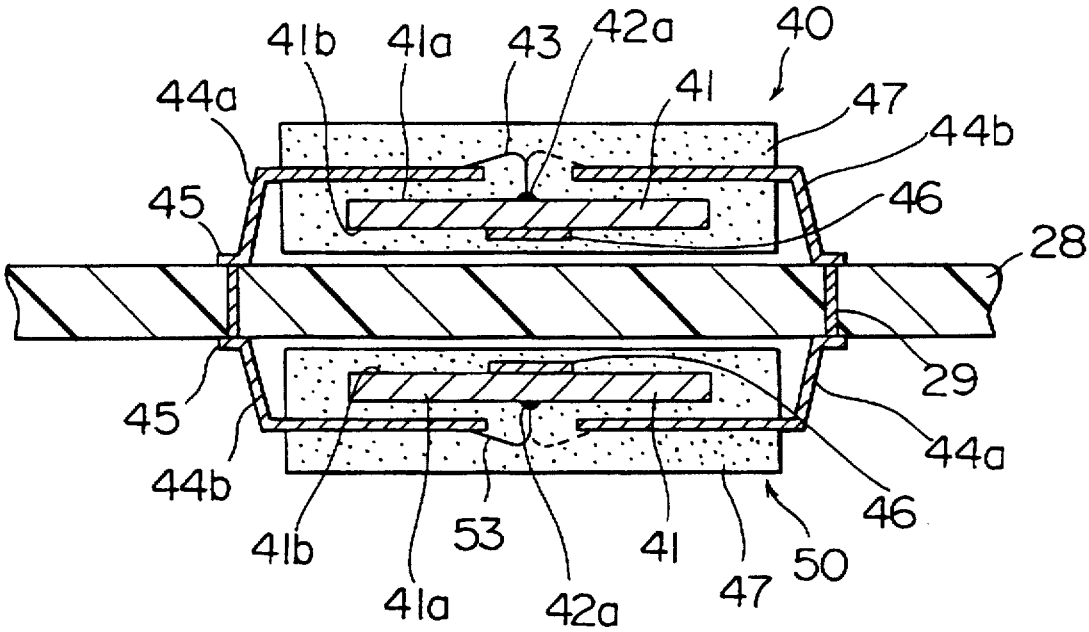
FIG. 6 is a cross-sectional view illustrating an IC module according to a second embodiment of the present invention.
Figure 7:
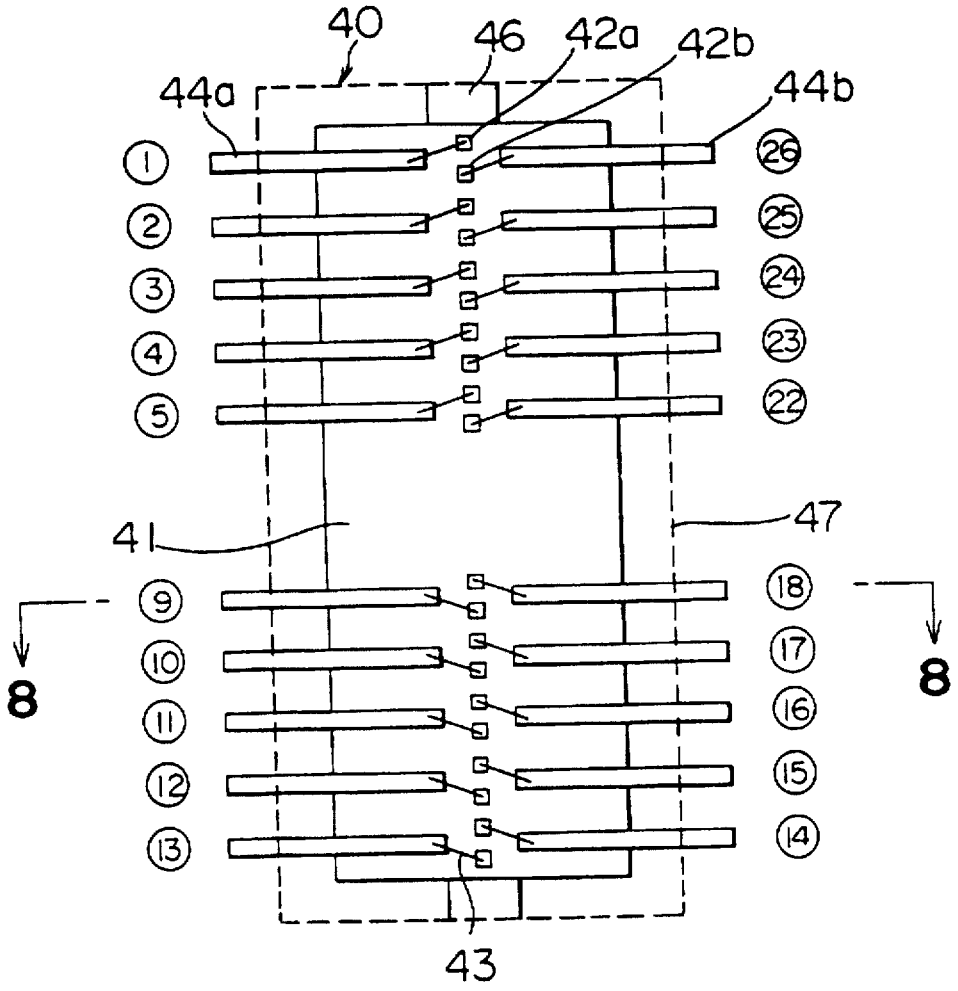
FIG. 7 is a plan view illustrating a standard type IC used in the second embodiment of the present invention.
Figure 8:
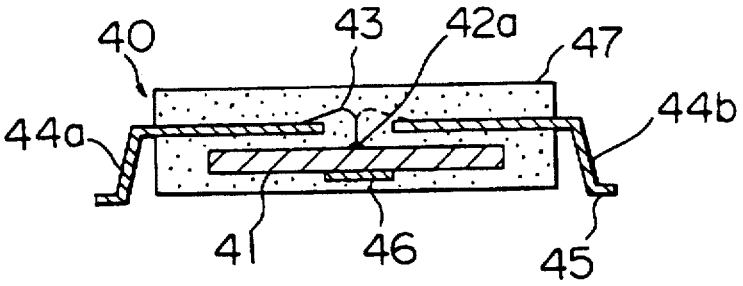
FIG. 8 is a cross-sectional view taken along the line [C—C] *8—8* of FIG. 7.

FIG. 6 shows an IC module according to the second embodiment of the present invention. A standard type IC 40 is mounted on the top surface of the mounting substrate 28, and an inversion type IC 50 is mounted on the bottom surface thereof. The standard type IC 40 is shown in FIGS. 7 and 8, and the inversion type IC 50 in FIGS. 9 and 10. The ICs 40 standard type IC 20, and the electrode pad for 0V reference voltage is connected to the twenty-sixth lead. In contrast, the electrode pad for 0V reference voltage is connected to the first lead of the inversion type IC 30, and the electrode pad for data input is connected to the twenty-sixth lead.

Therefore, if these ICs 20 and 30 are arranged on opposite sides of the mounting substrate 28 as shown in FIG. 1, the leads of both ICs 20 and 30, having the same functions, are at the same point with the mounting substrate 28 in between. The corresponding outer lead portions 25 and 35 of these leads are electrically connected to each other through via holes 29, serving as connecting members, provided in the mounting substrate 28.

The aforesaid inversion type IC 30 can be manufactured as set forth below. First, the semiconductor chip 21 is mounted on the die pad 36. Each of the electrode pads of the first electrode pad group 22a is connected via the wires 33 to the corresponding leads of the second lead group 34b, while each of the electrode pads of the second electrode pad group 22b is connected via the wires 33 to the corresponding leads of the first lead group 34a. Next, the semiconductor chip 21, the wires 33, the inner lead portions of the respective leads, and the die pad 36 are sealed by the main body of the package 27 so that the outer lead portions 35 of the leads are exposed. Thereafter, the outer lead portions and 50 each have a semiconductor chip 41, first and second lead groups 44a and 44b, a die pad 46 and a main body of a package 47. First and second electrode pad groups 42a and 42b alternate in a line traversing the longitudinal center of a surface 41a of the semiconductor chip 41. The inner lead portions of the first and second lead groups 44a and 44b are arrayed on both sides of the pad groups 42a and 42b, respectively.

Figure 9:
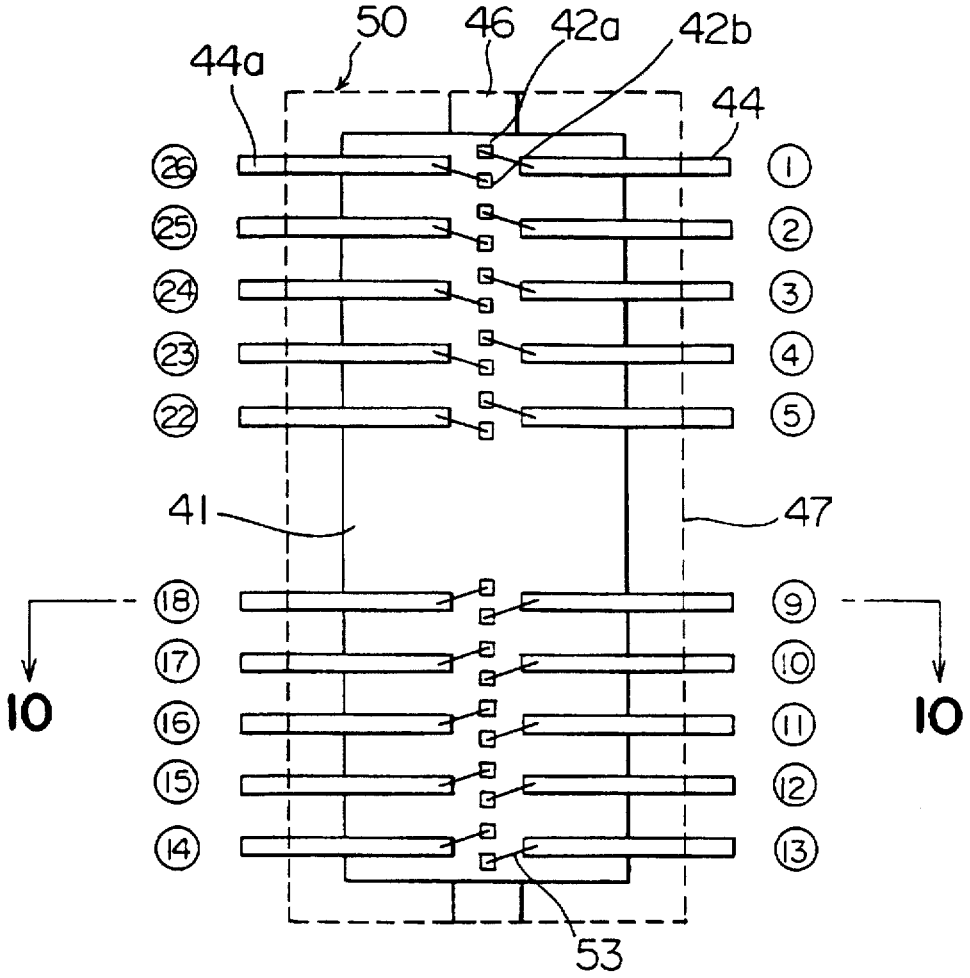
FIG. 9 is a plan view illustrating an inversion type IC used in the second embodiment.
Figure 10:
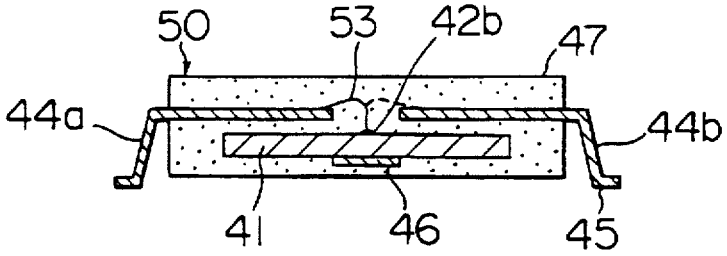
FIG. 10 is a cross-sectional view taken along the line [D—D] *10—10* of FIG. 9.

As shown in FIG. 7, in the standard type IC 40, each of the electrode pads of the pad group 42a of the semiconductor chip 41 is electrically connected via a corresponding wire 43 to an inner lead portion of a corresponding lead of the first lead group 44. Each of the electrode pads of the second electrode pad group 42b is electrically connected via one of wires 43 to an inner lead portion of a corresponding lead of the second lead group 44b. In contrast, in the inversion type IC 50, as shown in FIG. 9, each of the electrode pads of the first electrode pad group 42a of the semiconductor chip 41 is electrically connected via one of wires 53 to an inner lead portion of a corresponding lead of the second lead group 44b. Each of the electrode pads of the second electrode pad group 42b is electrically connected via one of wires 53 to an inner lead portion of a corresponding lead of the first lead group 44a In both the ICs 40 and 50, the outer lead portions 45 of the leads are bent toward the bottom surface 41b of the semiconductor chip 41.

As described above, when a semiconductor chip having electrode pads along its center line is used, the inversion type IC 50 can be manufactured easily by merely changing the connections of wires 43 and 53.

Figure 11:
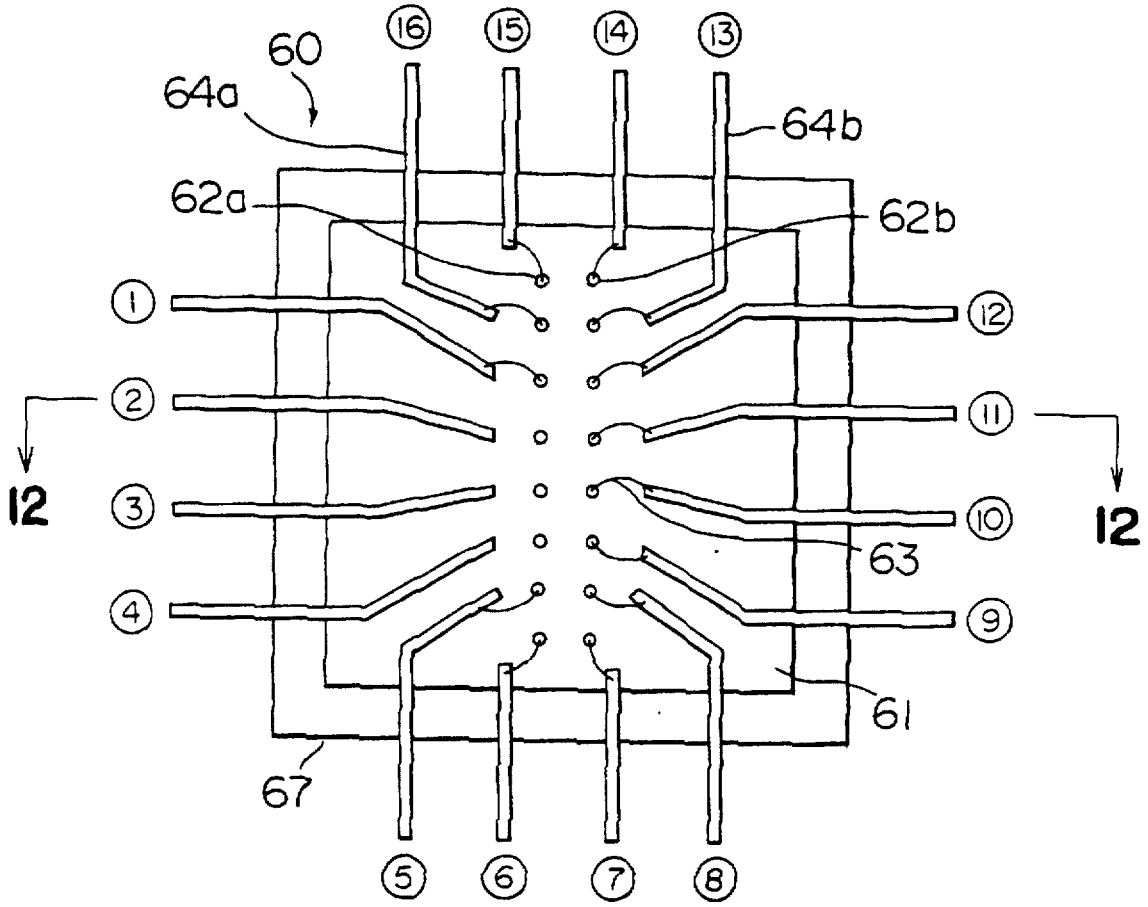
FIG. 11 is a plan view illustrating a standard type IC used in the third embodiment of the present invention.
Figure 12:
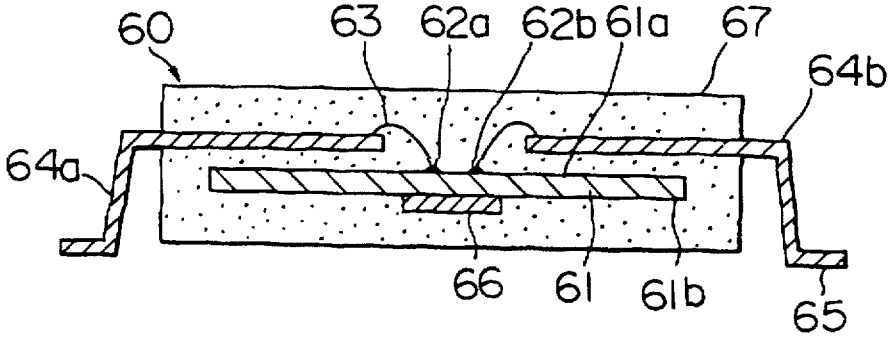
FIG. 12 is a cross-sectional view taken along the line [E—E] *12—12* of FIG. 11.

A standard type IC 60 used in the third embodiment is shown in FIGS. 11 and 12. In this IC 60, leads are guided from each of the four sides of a main body of a package 67. A semiconductor chip 61 is mounted on a die pad 66. A first lead group 64a formed of leads 1 to 6, 15 and 16, and a second lead group 64b formed of leads 7 to 14 are arranged above the semiconductor chip 61. A first electrode pad group 62a and a second electrode pad group 62b are arrayed parallel to each other on a surface 61a of the semiconductor chip 61. Each of the pads of the first electrode pad group 62a are electrically connected via one of wires 63 to an inner lead portion of a corresponding lead of a first lead group 64a. Each of the pads of the second electrode pad group 62b is electrically connected via corresponding wires 63 to the corresponding inner lead portions of the leads of a second lead group 64b. The outer lead portions 65 of the leads are bent toward the bottom surface 61b of the semiconductor chip 61.

Figure 13:
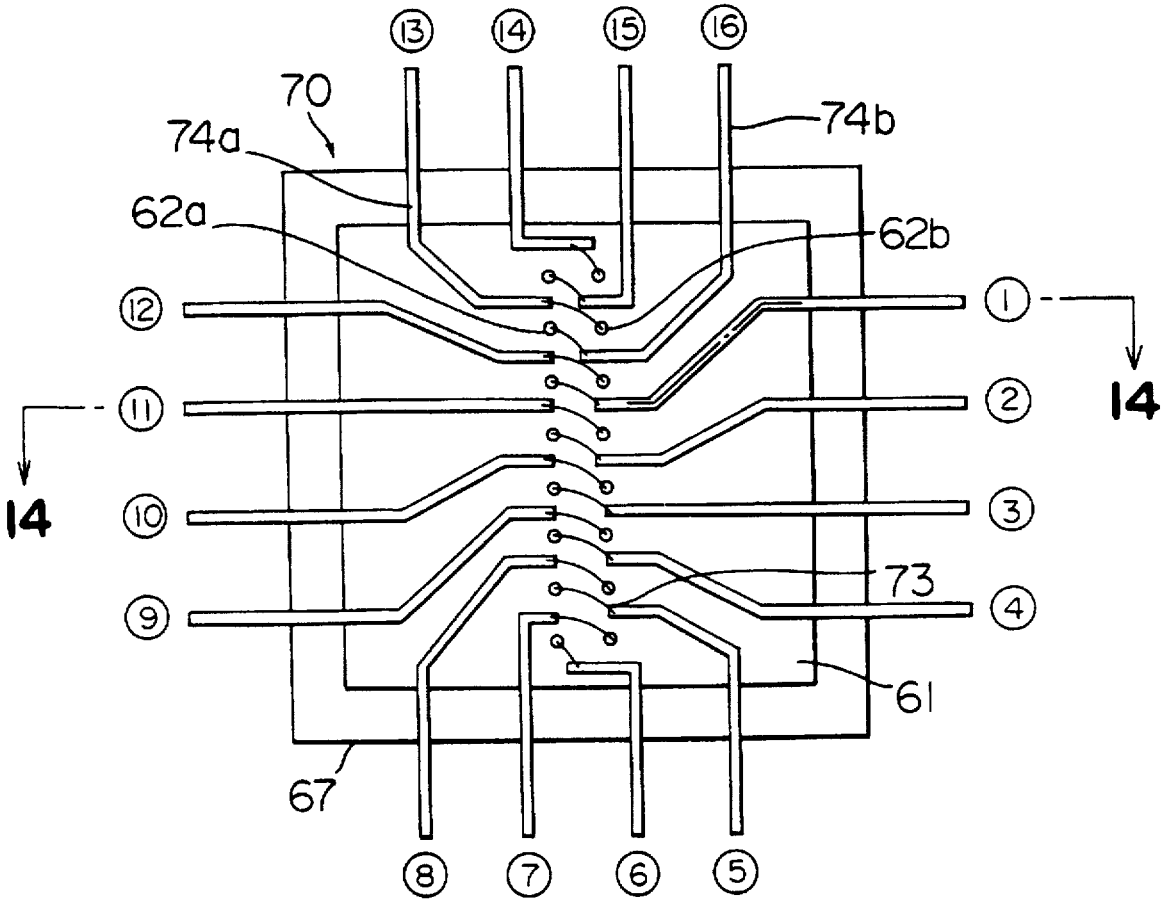
FIG. 13 is a plan view illustrating an inversion type IC used in the third embodiment of the present invention.
Figure 14:
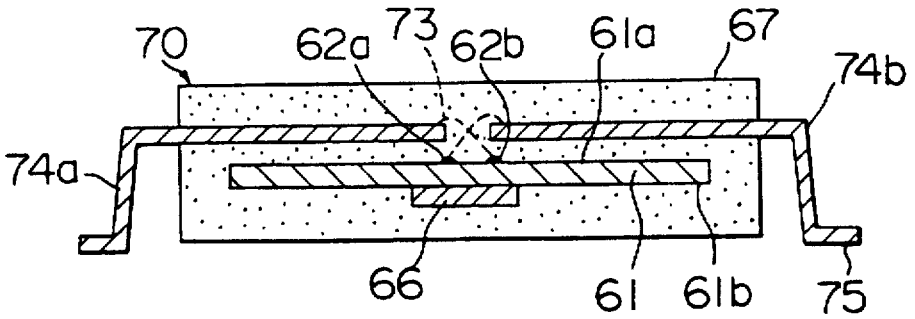
FIG. 14 is a cross-sectional view taken along the line [F—F] *14—14* of FIG. 13.

In contrast, in an inversion type IC 70, as shown in FIGS. 13 and 14, each of the pads of the first electrode pad group 62a of the semiconductor chip 61 is electrically connected via one of wires 73 to an inner lead portion of a corresponding lead of a second lead group 74b. Each of the pads of the second electrode pad group 62b is electrically connected via one of wires 73 to inner lead portion of a corresponding lead of the first lead group 74a. The outer lead portions 75 of the leads are bent toward the bottom surface 61b of the semiconductor chip 61 in the same manner as in the standard type IC 60.

By combining the standard type IC 60 and the inversion type IC 70, highly reliable IC modules can be manufactured with simple wiring in the same way as in the first and second embodiments.

Figure 15:
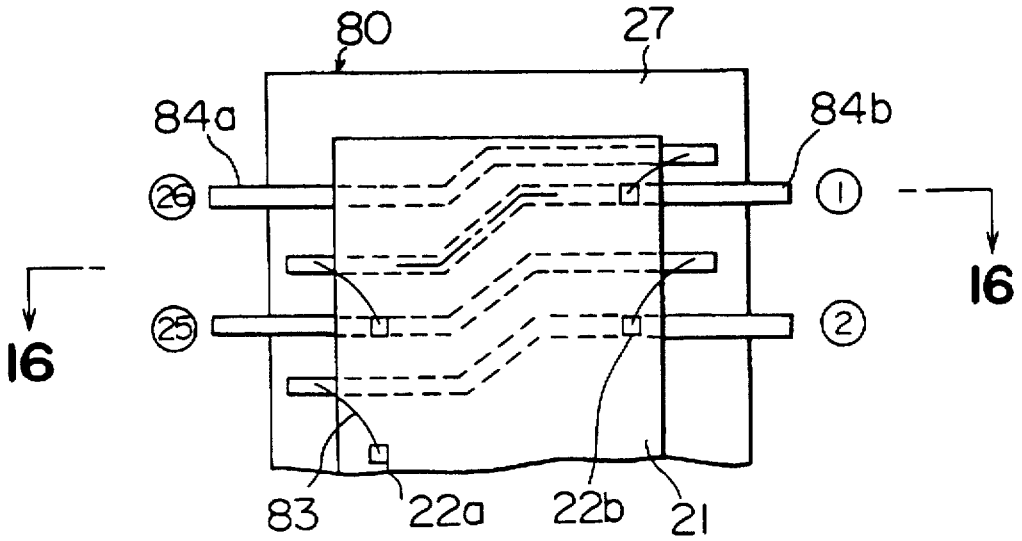
FIG. 15 is a plan view illustrating an inversion type IC used in a modification of the first embodiment of the present invention.
Figure 16:
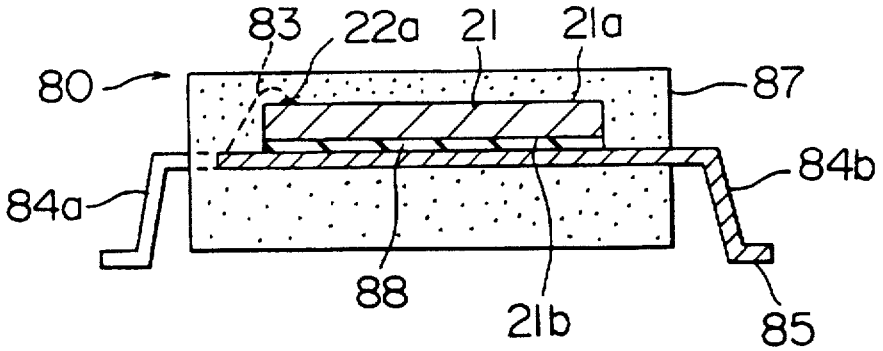
FIG. 16 is a cross-sectional view taken along the line [G—G] *16—16* of FIG. 15.

Although in the inversion type IC 30 used in the first embodiment, as shown in FIGS. 4 and 5; the first and second lead groups 34a and 34b are arranged above the surface 21a of the semiconductor chip 21, the present invention is not limited to this case. For example, as in an inversion type IC 80 shown in FIGS. 15 and 16, first and second lead groups 84a and 84b may be arranged transverse the bottom surface 21b of the semiconductor chip 21. In this case, since a dedicated die pad for supporting the bottom surface 21b of the semiconductor chip 21 cannot be provided, an insulating film 88 is bonded to the bottom surface 21b, and the semiconductor chip 21 is mounted on the first and second lead groups 84a and 84b with the insulating film 88 placed therebetween. Each of the pads of the first electrode pad group 22a of the semiconductor chip 21 is connected via one of wires 83 to a lead of the second lead group 84b. Each of the pads of the second electrode pad group 22b is connected via one of wires 83 to a lead of the first lead group 84a. These elements are sealed using a resin body of a package 87 so that the outer lead portions 85 of the leads are exposed.

Figure 17:
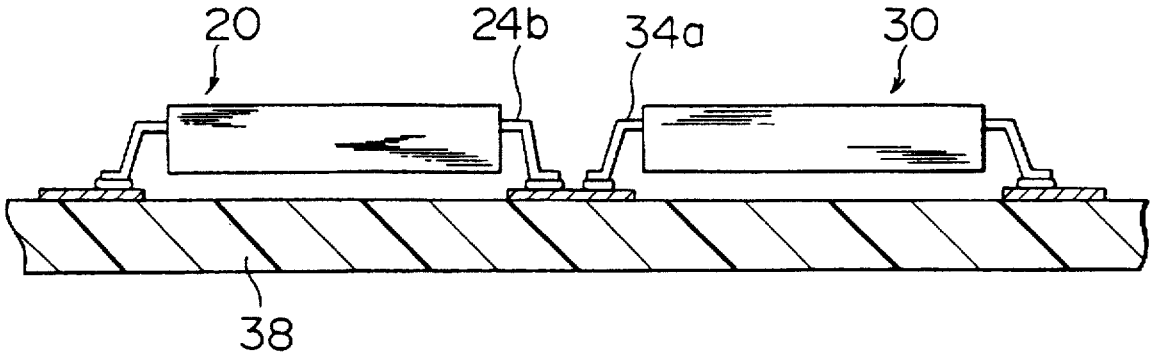
FIG. 17 is a cross-sectional view illustrating an IC module according to a fourth embodiment of the present invention.
Figure 18:
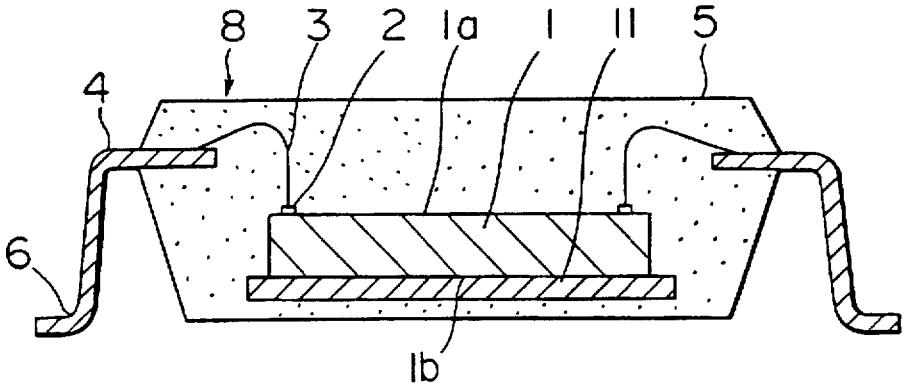
FIG. 18 PRIOR ART
FIG. 18 is a cross-sectional view illustrating a conventional IC.
Figure 19:
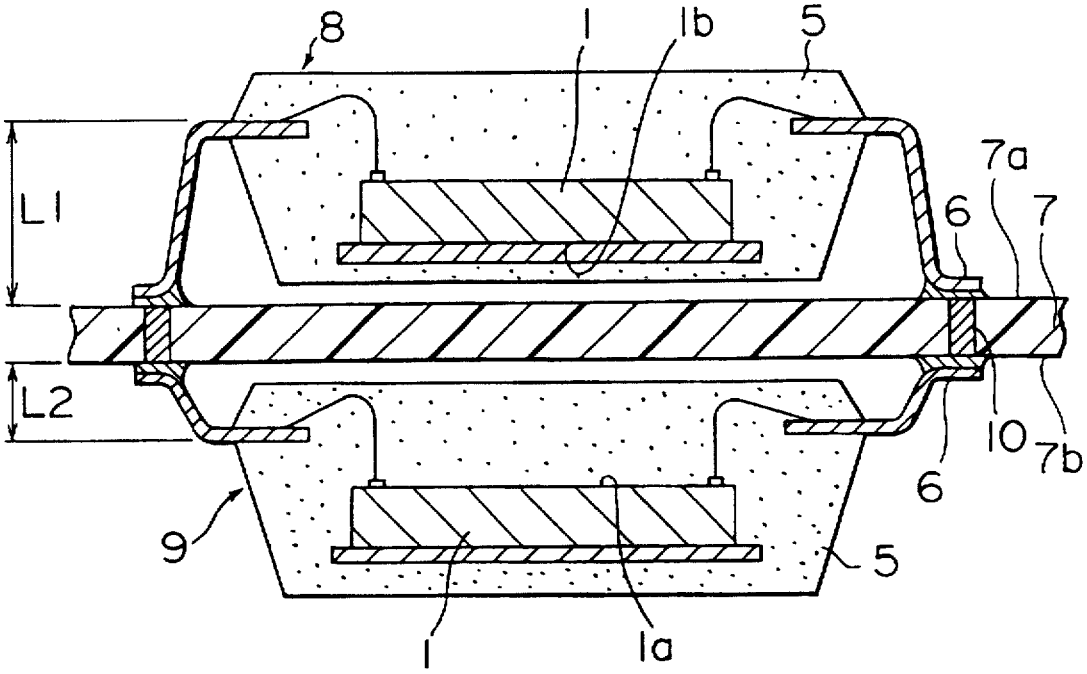
FIG. 19 PRIOR ART
FIG. 19 is a cross-sectional view illustrating a conventional IC module.

Although in the first embodiment the standard type IC 20 and the inversion type IC 30 are mounted on the top and bottom surfaces of the mounting substrate 28, respectively, the present invention is not limited to this case. As shown in FIG. 17, the standard type IC 20 and the inversion type IC 30 may be mounted on the top surface of the mounting substrate 38 in such a way that they are adjacent to each other. The leads having the same functions in both ICs 20 and 30, for example, each of the leads of the second lead group 24b of the standard type IC 20 and each of the leads of the first lead group 34b of the inversion type IC 30 are adjacent to each other and electrically connected to each other. In this case, through holes need not be provided on the mounting substrate 38.

What is claimed is:

1. The method of making pairs of packaged semiconductor chips having inverted lead relationships for direct mounting and parallel electrical connection of the pairs of packaged semiconductor chips with the packaged semiconductor chips opposed to each other, the method comprising:

preparing identical first and second semiconductor chips, each semiconductor chip including opposed top and bottom surfaces, *opposed first and second edges,* and first and second rows of electrode pads disposed on the top surface *proximate the first and second edges, respectively*;

mounting the first semiconductor chip on a die pad of a first lead frame, the first lead frame including first and second rows of peripherally disposed leads, the first row of leads being disposed proximate *the first edge and* the first row of electrode pads of the first semiconductor chip and the second row of leads being disposed proximate *the second edge and* the second row of electrode pads of the first semiconductor chip;

connecting the electrode pads of the first semiconductor chip in the first row to corresponding leads in the first row of leads of the first lead frame with wires and connecting the electrode pads of the first semiconductor chip in the second row to corresponding leads in the second row of leads of the first lead frame with wires;

encapsulating the first semiconductor chip, the die pad of the first lead frame, the wires, and parts of the leads of the first lead frame in a resin with part of the leads of the first lead frame extending from the resin; and bending the leads protruding from the resin encapsulating the first semiconductor chip toward the bottom surface of the first semiconductor chip;

mounting the second semiconductor chip on a die pad of a second lead frame, the second lead frame including first and second rows of peripherally disposed leads, *the first row of leads being disposed proximate the first edge and the second leads being disposed proximate the second edge,* the leads of the second lead frame extending across at least part of the die pad of the second lead frame and spaced from the top surface of the second semiconductor chip, the first row of leads including ends proximate the second row of electrode pads of the second semiconductor chip, and the second row of leads including ends proximate the first row of electrode pads of the second semiconductor chip;

connecting the electrode pads of the second semiconductor chip in the first row to corresponding leads in the second row of leads of the second lead frame with wires and connecting the electrode pads of the second semiconductor chip in the second row to corresponding leads in the first row of leads of the second lead frame with wires;

encapsulating the second semiconductor chip, the die pad of the second lead frame, the wires, and parts of the leads of the second lead frame in a resin with part of the leads of the second lead frame extending from the resin; and bending the leads protruding from the resin encapsulating the second semiconductor chip toward the bottom surface of the second semiconductor chip *whereby the encapsulated first and second semiconductor chips have inverted lead relationships.*

2. A method of making [pair] *pairs* of packaged semiconductor chips having inverted lead relationships for direct mounting and parallel electrical connection of the pairs of packaged semiconductor chips with the packaged semiconductor chips opposed to each other, the method comprising:

preparing identical first and second semiconductor chips, each semiconductor chip including opposed top and bottom surfaces, *opposed first and second edges,* and a first row of electrode pads, alternating electrode pads in the first row being designated odd and even pads, disposed on the top surface;

mounting the first semiconductor chip on a die pad of a first lead frame, the first lead frame including first and second rows of peripherally disposed leads, the first row of leads being disposed proximate the *first edge and the* odd electrode pads of the first semiconductor chip, and the second row of leads being disposed proximate *the second edge* the even electrode pads of the semiconductor chip;

connecting the odd electrode pads of the first semiconductor chip to corresponding leads in the first row of leads of the first lead frame with wires and connecting the even electrode pads of the first semiconductor chip to corresponding leads in the second row of leads of the first lead frame with wires;

encapsulating the first semiconductor chip, the die pad of the first lead frame, the wires, and parts of the leads of the first lead frame in a resin with part of the leads of the first lead frame extending from the resin; and bending the leads protruding from the resin encapsulating the first semiconductor chip toward the bottom surface of the first semiconductor chip;

mounting the second semiconductor chip on a die pad of a second lead frame, the second lead frame including first and second rows of peripherally disposed leads, the first row of leads of the second lead frame being disposed proximate *the first edge and* proximate the even electrode pads and the second row of leads of the second lead frame being disposed proximate the odd electrode pads;

connecting the even electrode pads of the second semiconductor chip to corresponding leads in the first row of leads of the second lead frame with wires and connecting the odd electrode pads of the second semiconductor chip to corresponding leads in the second row of leads of the second lead frame with wires;

encapsulating the second semiconductor chip, the die pad of the second lead frame, the wires, and parts of the leads of the second lead frame in a resin with part of the leads of the second lead frame extending from the resin; and bending the leads protruding from the resin encapsulating the second semiconductor chip toward the bottom surface of the second semiconductor chip *whereby the encapsulated first and second semiconductor chips have inverted lead relationships.*

3. A packaged semiconductor chip module comprising:

a mounting substrate having opposed first and second surfaces;

a non-inverted packaged semiconductor chip mounted on the first surface of the mounting substrate, the non-inverted [package] *packaged* semiconductor chip including a plurality of leads arranged in first and second rows, a first semiconductor chip having opposed *first and second edges and opposed* top and bottom surfaces, a plurality of electrode pads arranged in first and second rows on the top surface of the first semiconductor chip *proximate the first and second edges, respectively*, and wires connecting leads of the first and second rows of leads to corresponding electrode pads of the first and second rows of electrode pads, respectively, each of the leads including an outer lead portion extending from the [noninverted] *non-inverted* packaged semiconductor chip wherein the outer lead portions of the leads are bent toward the bottom surface of the first semiconductor chip and the bottom surface of the first semiconductor chip faces the first surface of the mounting substrate;

an inverted packaged semiconductor chip mounted on the second surface of the mounting substrate and including a plurality of leads arranged in first and second rows, a second semiconductor chip identical to the first semiconductor chip and having *opposed first and second edges and* opposed top and bottom surfaces, a plurality of electrode pads arranged in first and second rows on the top surface of the semiconductor chip *proximate the first and second edges, respectively*, and wires connecting leads of the second and first rows of leads to corresponding electrode pads of the first and second rows of electrode pads, respectively, each of the leads including an outer lead portion extending from the inverted packaged semiconductor chip wherein the outer lead portions of the leads are bent toward the bottom surface of the second semiconductor chip and the bottom surface of the second semiconductor chip faces the second surface of the mounting substrate; and a plurality of connecting members on and penetrating the mounting substrate, electrically connecting leads of the [noninverted] *non-inverted* packaged semiconductor chip to corresponding leads of the inverted packaged semiconductor chip.

4. The packaged semiconductor chip module of claim 3 wherein each of the non-inverted packaged semiconductor chip and the inverted packaged semiconductor chip includes a resin package encapsulating the first and second semiconductor chips, the wires, and parts of the first and second rows of leads so that outer portions of the leads protrude from the respective packages and each of the leads in the inverted packaged semiconductor chip crosses part of and is spaced from the top surface of the second semiconductor chip.

5. The packaged semiconductor chip module of claim 4 wherein the inverted and non-inverted packaged semiconductor chips are substantially rectangular and the outer lead portions extend from opposite sides of each of the inverted and non-inverted semiconductor chip packages.

6. The packaged semiconductor chip module of claim 4 wherein the inverted and non-inverted packaged semiconductor chips are substantially rectangular and the outer lead portions extend from four sides of each of the inverted and non-inverted semiconductor chip packages.

7. A packaged semiconductor chip module comprising:

a mounting substrate having opposed first and second surfaces;

a non-inverted packaged semiconductor chip mounted on the first surface of the mounting substrate, the non-inverted packaged semiconductor chip including a plurality of leads arranged in first and second rows, a first semiconductor chip having opposed *first and second edges and opposed* top and bottom surfaces, a plurality of electrode pads arranged in first and second rows on the top surface of the first semiconductor chip *proximate the first and second edges, respectively*, and wires connecting leads of the first and second rows of leads to corresponding electrode pads of the first and second rows of electrode pads, respectively, each of the leads including an outer lead portion extending from the [noninverted] *non-inverted* packaged semiconductor chip wherein the outer lead portions of the leads are bent toward the bottom surface of the first semiconductor chip and the bottom surface of the first semiconductor chip faces the first surface of the mounting substrate;

an inverted packaged semiconductor chip mounted on the first surface of the mounting substrate and including a plurality of leads arranged in first and second rows, a second semiconductor chip identical to the first semiconductor chip and having *opposed first and second edges and* opposed top and bottom surfaces, a plurality of electrode pads arranged in first and second rows on the top surface of the semiconductor chip *proximate the first and second edges, respectively*, and wires connecting leads of the second and first rows of leads to corresponding electrode pads of the first and second rows of electrode pads, respectively, each of the leads including an outer lead portion extending from the inverted packaged semiconductor chip wherein the outer lead portions of the leads are bent toward the bottom surface of the second semiconductor chip and the bottom surface of the second semiconductor chip faces the first surface of the mounting substrate; and a plurality of connecting members on and penetrating the mounting substrate, electrically connecting leads of the [noninverted] *non-inverted* packaged semiconductor chip to corresponding leads of the inverted packaged semiconductor chip.

8. The packaged semiconductor chip module of claim 7 wherein each of the non-inverted packaged semiconductor chip and the inverted packaged semiconductor chip includes a resin package encapsulating the first and second semiconductor chips, the wires, and the first and second rows of leads so that outer portions of the leads protrude from the respective packages and each of the leads in the inverted packaged semiconductor chip crosses part of and is spaced from the top surface of the second semiconductor chip.

9. The packaged semiconductor chip module of claim 8 wherein the inverted and non-inverted packaged semiconductor chips are substantially rectangular and the outer lead portions extend from opposite sides of each of the inverted and non-inverted semiconductor chip packages.

10. The packaged semiconductor chip module of claim 8 wherein the inverted and non-inverted packaged semiconductor chips are substantially rectangular and the outer lead portions extend from four sides of each of the inverted and non-inverted semiconductor chip packages.

11. A packaged semiconductor chip module comprising:

a mounting substrate having opposed first and second surfaces;

a non-inverted packaged semiconductor chip mounted on the first surface of the mounting substrate, the non-inverted packaged semiconductor chip including a plurality of leads arranged in first and second rows, a first semiconductor chip having *opposed first and second edges and* opposed top and bottom surfaces, a plurality of electrode pads arranged in a row on the top surface of the first semiconductor chip with alternating electrode pads in the row designated [as] odd and even electrode pads, and wires connecting leads of the first and second rows to corresponding odd and even electrode pads, respectively, each of the leads including an outer lead portion extending from the non-inverted packaged semiconductor chip wherein the outer lead portions of the leads are bent toward the bottom surface of the first semiconductor chip and the bottom surface of the first semiconductor chip faces the first surface of the mounting substrate;

an inverted packaged semiconductor chip mounted on the second surface of the mounting substrate and including a plurality of leads arranged in first and second rows, a second semiconductor chip identical to the first semiconductor chip and having *opposed first and second edges and* opposed top and bottom surfaces, a plurality of electrode pads arranged in a row on the top surface of the second semiconductor chip with alternating electrode pads in a row designated odd and even electrode pads, and wires connecting leads of the second and first rows to corresponding odd and even electrode pads, respectively, each of the leads including an outer lead portion extending from the inverted packaged semiconductor chip wherein the outer lead portions of the leads are bent toward the bottom surface of the second semiconductor chip and the bottom surface of the second semiconductor chip faces the second surface of the mounting substrate; and a plurality of connecting members on and penetrating the mounting substrate, electrically connecting leads of the [noninverted] *non-inverted* packaged semiconductor chip to corresponding leads of the inverted packaged semiconductor chip.

12. The packaged semiconductor chip module of claim 11 wherein each of the non-inverted packaged semiconductor chip and the inverted packaged semiconductor chip includes a resin package encapsulating the first and second semiconductor chips, the wires, and parts of the first and second rows of leads so that outer portions of the leads protrude from the respective packages and each of the leads in the inverted packaged semiconductor chip crosses part of and is spaced from the top surface of the second semiconductor chip.

13. The packaged semiconductor chip module of claim 12 wherein the inverted and non-inverted packaged semiconductor chips are substantially rectangular and the outer lead portions extend from opposite sides of each of the inverted and non-inverted semiconductor chip packages.

[14. The packaged semiconductor chip module of claim 12 wherein the inverted and non-inverted packaged semiconductor chips are substantially rectangular and the outer lead portions extend from four sides of each of the inverted and non-inverted semiconductor chip packages.]

15. A packaged semiconductor chip module comprising:

a mounting substrate having opposed first and second surfaces;

a non-inverted packaged semiconductor chip mounted on the first surface of the mounting substrate, the non-inverted packaged semiconductor chip including a plurality of leads arranged in first and second rows, a first semiconductor chip having *opposed first and second edges and* opposed top and bottom surfaces, a plurality of electrode pads arranged in a row [with alternating electrode pads designated as odd and even electrode pads] on the top surface of the first semiconductor chip with alternating electrode pads in the row designated [as] odd and even electrode pads, and wires connecting leads of the first and second rows to corresponding odd and even electrode pads, respectively, each of the leads including an outer lead portion extending from the non-inverted packaged semiconductor chip wherein the outer lead portions of the leads are bent toward the bottom surface of the first semiconductor chip and the bottom surface of the first semiconductor chip faces the first surface of the mounting substrate;

an inverted packaged semiconductor chip mounted on the first surface of the mounting substrate and including a plurality of leads arranged in first and second rows, a second semiconductor chip identical to the first semiconductor chip and having *opposed first and second edges and* opposed top and bottom surfaces, a plurality of electrode pads arranged in a row on the top surface of the second semiconductor chip with alternating electrode pads in a row designated odd and even electrode pads, and wires connecting leads of the second and first rows to corresponding odd and even electrode pads, respectively, each of the leads including an outer lead portion extending from the inverted packaged semiconductor chip wherein the outer lead portions of the leads are bent toward the bottom surface of the second semiconductor chip and the bottom surface of the second semiconductor chip faces the first surface of the mounting substrate; and a plurality of connecting members on and penetrating the mounting substrate, electrically connecting leads of the [noninverted] *non-inverted* packaged semiconductor chip to corresponding leads of the inverted packaged semiconductor chip.

16. The packaged semiconductor chip module of claim 15 wherein each of the non-inverted packaged semiconductor chip and the inverted packaged semiconductor chip includes a resin package encapsulating the first and second semiconductor chips, the wires, and the first and second rows of leads so that outer portions of the leads protrude from the respective packages and each of the leads in the inverted packaged semiconductor chip crosses part of and is spaced from the top surface of the second semiconductor chip.

17. The packaged semiconductor chip module of claim 16 wherein the inverted and non-inverted packaged semiconductor chips are substantially rectangular and the outer lead portions extend from opposite sides of each of the inverted and non-inverted semiconductor chip packages.

[18. The packaged semiconductor chip module of claim 16 wherein the inverted and non-inverted packaged semiconductor chips are substantially rectangular and the outer lead portions extend from four sides of each of the inverted and non-inverted semiconductor chip packages.]

19. A pair of non-*inverted and inverted packaged semiconductor devices wherein,*

*the non-inverted packaged semiconductor device comprises:*

*a plurality of leads arranged in first and second rows;*

*a first semiconductor chip having opposed first and second edges and opposed top and bottom surfaces and a plurality of electrode pads arranged in first and second rows proximate the first and second edges, respectively, on the top surface of the first semiconductor chip;*

*wires connecting leads of the first and second rows of leads to corresponding electrode pads of the first and second rows of electrode pads, respectively; and*

*a resin body encapsulating the first semiconductor chip, the wires, and parts of the leads, each of the leads including an outer lead portion extending outside the resin package wherein the outer lead portions are bent toward the bottom surface of the first semiconductor chip; and*

*the inverted packaged semiconductor device comprises:*

*a plurality of leads arranged in first and second rows;*

*a second semiconductor chip identical to the first semiconductor chip and having opposed first and second edges and opposed top and bottom surfaces and a plurality of electrode pads arranged in first and second rows on the top surface of the second semiconductor chip;*

*wires connecting leads of the second and first rows of leads to corresponding electrode pads of the first and second rows of electrode pads, respectively; and*

*a resin body encapsulating the second semiconductor chip, the wires, and parts of the leads, each of the leads including an outer lead portion extending outside the resin package wherein the outer lead portions are bent toward the bottom surface of the second semiconductor chip.*

*20. The pair of non-inverted and inverted packaged semiconductor devices of claim 19 wherein each of the leads in the inverted packaged semiconductor device crosses part of and is spaced from the top surface of the second semiconductor chip.*

*21. The pair of non-inverted and inverted packaged semiconductor devices of claim 20 wherein the resin bodies of the inverted and non-inverted packaged semiconductor devices are substantially rectangular and the outer lead portions extend from opposite sides of each of the inverted and non-inverted packaged semiconductor devices.*

*22. The pair of non-inverted and inverted packaged semiconductor devices of claim 20 wherein the resin bodies of the inverted and non-inverted packaged semiconductor devices are substantially rectangular and the outer lead portions extend from four sides of each of the inverted and non-inverted packaged semiconductor devices.*

*23. A pair of non-inverted and inverted packaged semiconductor devices wherein,*

*the non-inverted packaged semiconductor device comprises:*

*a first semiconductor chip having opposed first and second edges and opposed top and bottom surfaces and a plurality of electrode pads arranged in a row on the top surface of the first semiconductor chip with alternating electrode pads in the row designated odd and even electrode pads;*

*a plurality of leads arranged in first and second rows proximate the first second edges, respectively;*

*wires connecting leads of the first and second rows to corresponding odd and even electrode pads, respectively; and*

*a resin body encapsulating the first semiconductor chip, the wires, and parts of the leads, each of the leads including an outer lead portion extending outside the resin package wherein the outer lead portions are bent toward the bottom surface of the first semiconductor chip; and*

*the inverted packaged semiconductor device comprises:*

*a second semiconductor chip identical to the first semiconductor chip and having opposed first and second edges and opposed top and bottom surfaces and a plurality of electrode pads arranged in a row on the top surface of the second semiconductor chip with alternating electrode pads in the row designated odd and even electrode pads;*

*a plurality of leads arranged in first and second rows proximate the first and second edges, respectively;*

*wires connecting leads of the second and first rows to corresponding odd and even electrode pads, respectively; and*

*a resin body encapsulating the second semiconductor chip, the wires, and parts of the leads, each of the leads including an outer lead portion extending outside the resin package wherein the outer lead portions are bent toward the bottom surface of the second semiconductor chip.*

*24. The pair of non-inverted and inverted packaged semiconductor devices of claim 23 wherein each of the leads in the inverted packaged semiconductor device crosses part of and is spaced from the top surface of the second semiconductor chip.*

*25. The pair of non-inverted and inverted packaged semiconductor devices of claim 24 wherein the resin bodies of the inverted and non-inverted packaged semiconductor devices are substantially rectangular and the outer lead portions extend from opposite sides of each of the inverted and non-inverted packaged semiconductor devices.*

* * * * *